United States Patent
Saib et al.

(10) Patent No.: US 6,505,346 B2
(45) Date of Patent: *Jan. 7, 2003

(54) STATION JUMP LOOP

(75) Inventors: Joseph I. Saib, San Diego, CA (US); James K. Leahey, La Jolla, CA (US); Gail White, San Diego, CA (US); Satoru Nemoto, San Diego, CA (US); Peter Jordan, New Hope, PA (US)

(73) Assignees: Sony Corporation, Tokyo (JP); Sony Electronics, Inc., Park Ridge, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 96 days.

(21) Appl. No.: 08/870,465

(22) Filed: Jun. 6, 1997

(65) Prior Publication Data

US 2001/0005905 A1 Jun. 28, 2001

(51) Int. Cl.[7] .......................... H04N 5/50; H04N 5/44; H04N 7/173

(52) U.S. Cl. .......................... 725/38; 725/47; 725/134; 348/731

(58) Field of Search ................................. 348/734, 731, 348/211, 114, 725, 733; 455/352, 186.1, 186.2, 150.1, 151.1, 151.2, 151.3, 184.1; 369/7; 381/86; 340/825 T; 725/37–61

(56) References Cited

U.S. PATENT DOCUMENTS

| | | | | |
|---|---|---|---|---|
| 4,737,993 A | * | 4/1988 | DeVilbiss | 348/731 |
| 5,161,023 A | * | 11/1992 | Keenan | 348/731 |
| 5,307,513 A | * | 4/1994 | Harada | 455/186.1 |
| 5,315,392 A | * | 5/1994 | Ishikawa et al. | 348/570 |
| 5,317,403 A | * | 5/1994 | Keenan | 348/731 |
| 5,323,240 A | * | 6/1994 | Amano et al. | 348/731 |
| 5,410,326 A | * | 4/1995 | Glodstein | 348/734 |
| 5,530,924 A | * | 6/1996 | Miller | 455/186.1 |
| 5,532,832 A | * | 7/1996 | Hailey et al. | 348/732 |
| 5,594,509 A | * | 1/1997 | Florin et al. | 348/731 |
| 5,635,989 A | * | 6/1997 | Rothmuller | 348/563 |
| 5,719,637 A | * | 2/1998 | Ohkura et al. | 348/564 |
| 5,801,747 A | * | 9/1998 | Bedard | 348/1 |

FOREIGN PATENT DOCUMENTS

WO      96/31980      * 10/1996      .......... H04N 5/445

* cited by examiner

*Primary Examiner*—Andrew Faile
*Assistant Examiner*—Reuben M. Brown
(74) *Attorney, Agent, or Firm*—Blakely, Sokoloff, Taylor & Zafman LLP

(57) ABSTRACT

The present invention is implemented in one embodiment in a tuning decoder device, such as an Integrated Receiver Decoder (IRD) of a digital satellite system. The IRD is coupled to a satellite system, the remote controller and a monitor, such as a TV set. The present invention allows a user to store up to five stations in a JUMP Loop sequence during a single viewing period by depressing a single key in a remote controller.

18 Claims, 5 Drawing Sheets

STATION JUMP LOOP

BACKGROUND OF THE INVENTION

1. Field of the Invention

The present invention relates generally to user interface devices. More specifically, the present invention pertains to a user's ability to tune to a plurality of stations during a viewing period.

2. Description of Related Art

A television (TV) remote controller has a number of functions that are accessible to a user by pushing a particular key on the remote that corresponds to that function. One such function is the "JUMP" function. At any time when a user tunes to a station (e.g., station A) and then presses a "JUMP" key/button on the TV remote controller, the TV tunes to a prior tuned station (e.g., station B). In other words, the TV was tuned to station B before it tuned to station A. If the user presses the JUMP button again, the TV tunes to the prior station, in this case station A. Thus, the one JUMP button enables one user to toggle between the two most recently tuned stations. The JUMP function therefore allows the user to jump between the two most recently tuned stations instead of "surfing" through all the possible channels between the two stations. It follows that if the TV is tuned to station A and the user tunes to station C, the subsequent selection of the JUMP function will cause the TV to tune back to station A and toggling is achieved between station A and station C using the JUMP button.

Some remotes not only include a JUMP function but also include a favorite program function. For example, one cable box has a LAST CHANNEL RECALL ("LC") button/key that allows a user to toggle back and forth between the last channel tuned and the currently tuned channel. The "LC" key acts like a standard "JUMP" key. In addition, the remote for the cable box has a favorite channel operation using a separate key labeled "PRGM" for adding favorite channels to a favorite channel queue in a semi-permanent way. The user tunes to the channel desired, then presses the "PRGM" key to add that channel as a favorite channel. The favorite channels are stored in nonvolatile memory such that the user can utilize them in a permanent manner (i.e., over numerous viewing periods). Once a channel is stored as a favorite channel, a user clicks on yet another key labeled "FC" to surf or scan through all the stored favorite channels. In order to delete all the currently stored favorite channels, the user must first press still another key labeled "F" then a second key titled "DELETE." If, however, the user wishes to remove a particular favorite channel, a different procedure is followed. The user must tune to the channel to be deleted, then press the "DELETE" key.

SUMMARY

A method and apparatus for providing a multi-station JUMP function is described. The present invention expands upon the prior art JUMP function, which only allowed a user to toggle between the two most recently tuned stations. In contrast, the present invention allows a user to jump among any two or more stations, not just the two most recently tuned stations. Moreover, the present invention allows the user to assign up to five stations during a single viewing period as well as add and remove stations during a single viewing period with a single key. Furthermore, the JUMP Loop function is user-friendly as the same single key is used to jump, to store and to delete the stations in the JUMP Loop.

BRIEF DESCRIPTION OF THE DRAWINGS

The present invention is illustrated by way of example and not a limitation in the figures of the accompanying drawings in which like references indicate similar elements.

DETAILED DESCRIPTION

A method and apparatus for use with a tuning device is described. Although the present invention is described using a direct broadcast satellite system, it is apparent to one skilled in the art that other broadcast systems that have the capability of receiving and displaying a multiplicity of stations may also utilize the method and apparatus of the present invention. Furthermore, in the following description, for the purposes of explanation, numerous details are set forth in order to provide a thorough understanding of the present invention. It will be apparent, however, to one skilled in the art that these specific details are not required in order to practice the present invention. In other instances, well-known electrical structures and circuits are shown in block diagram form in order not to unnecessarily obscure the present invention.

Although the present invention in the following description is described or implemented using a satellite receiver, it will be appreciated by those skilled in the art that the present invention is not limited to utilizing a direct broadcast satellite receiver. Thus, the present invention can be used not only with an Integrated Receiver Decoder (IRD), but can also be used with TVs, VCRs and with any other tuning device or broadcast method.

Figure 1A:
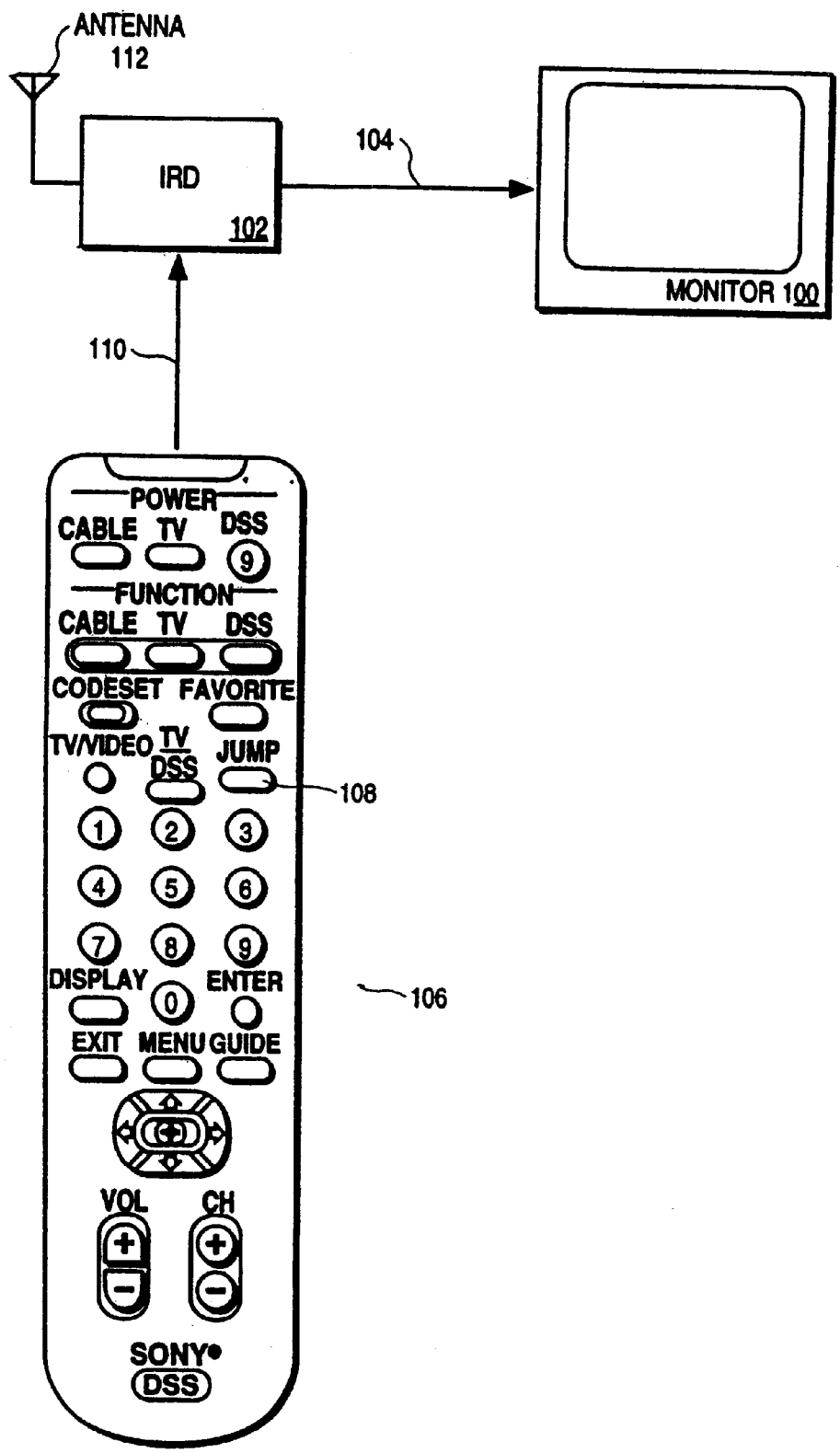
FIG. 1A is a simplified diagram illustrating a Direct Broadcast Satellite system (DSS).

FIG. 1A is a simplified diagram illustrating a Direct Broadcast Satellite system (DSS). The system has an antenna 112, an Integrated Receiver Decoder 102 (IRD), a remote controller 106 and a monitor 100, such as a TV set. The remote controller 106 has a JUMP key 108, which will be discussed in greater detail later. Packets of data are transmitted by a transponder on the satellite. Each transponder (not shown) transmits data in a timeshare manner at a predetermined frequency. A tuner 21 (shown in FIG. 2) of an Integrated Receiver Decoder 102 is tuned in to the frequency of the transponder corresponding to a channel or station, which is designated by viewers so that the packets of digital data are received by the IRD 102.

The antenna 112 receives an encoded data signal sent from a satellite. The received encoded signal is then decoded by the IRD 102. The antenna 112 has a Low Noise Block down converter (LNB). The LNB converts a frequency of a signal sent from the satellite to another frequency. The converted signal is then supplied to the IRD 102. The monitor 100 (e.g., a TV set) then receives the signal from the IRD 102.

Figure 1B:
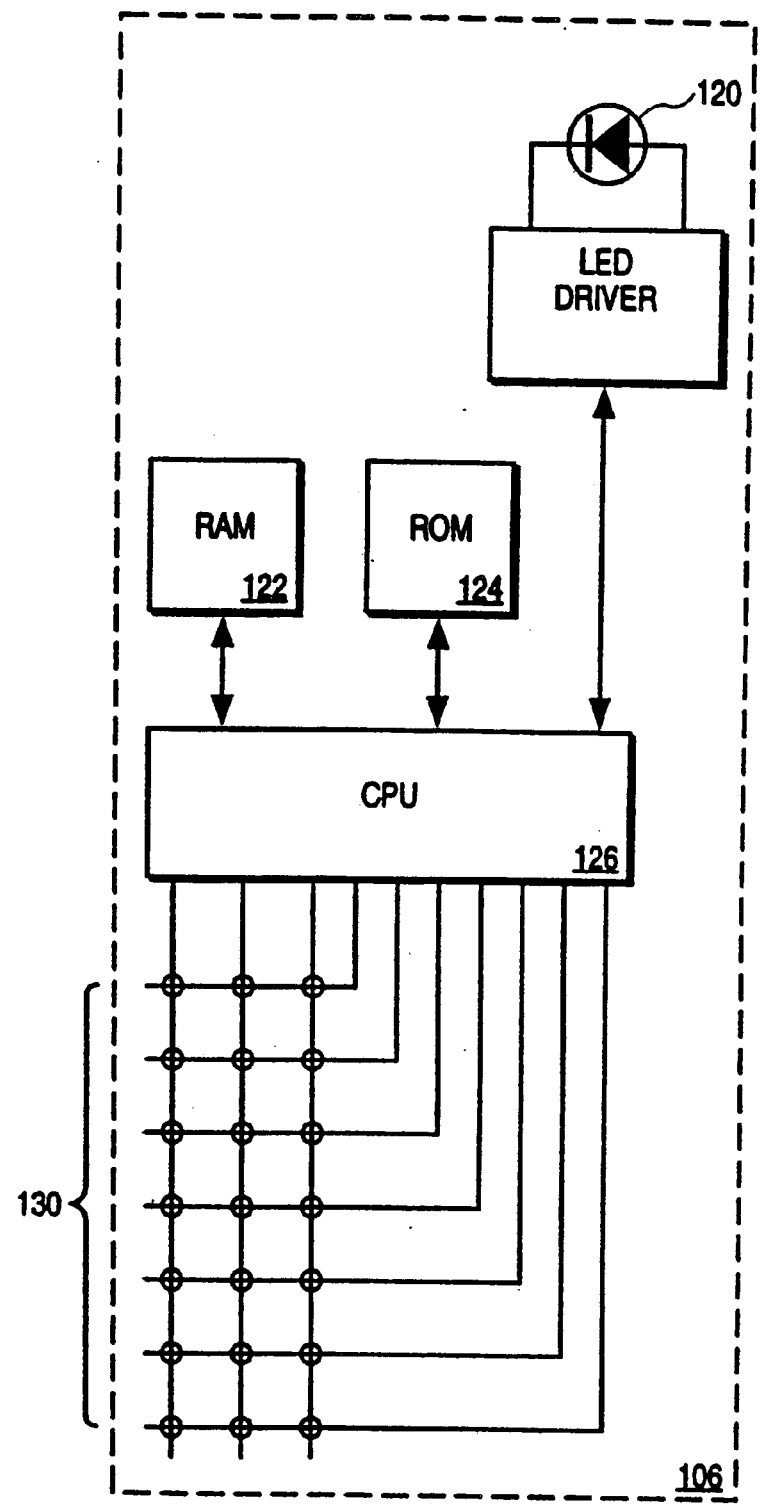
FIG. 1B is a simplified block diagram of a remote controller.

FIG. 1B is a simplified block diagram of one embodiment of the remote controller 106. The remote controller 106 has an infrared originating device 120, a set of operation keys 130, a CPU (Central Processing Unit) 126, a ROM (Read Only Memory) 122 and a RAM (Random Access Memory) 122. The CPU 126 receives a signal sent from an operation key 130 through an input port. The signal is processed according to a program stored in the ROM 124. The RAM 122 is used as a working space so as to produce a transmitting code. The transmitting code is then sent to the infrared originating device 120 through an output port and converted into an infrared signal. The infrared signal is then transmitted 110 to the IRD 102 (as shown in FIG. 1A).

The operation keys 130, in one embodiment, include a "JUMP" key 108, and other keys, such as a direction key for designating a pointer direction such as north, south, east and west, an "ENTER" key and an "EXIT" key, and a 10-key numeric key pad. The "JUMP" key 108 allows the user to selectively store a plurality of stations during a single viewing period in a JUMP Loop. The viewer is able to reset or select a new set of stations to be a part of the JUMP Loop during a single viewing period. A single viewing period begins when the user turns on an IRD 102 and ends when the user turns off the IRD 102. At the end of the viewing period, the stations that are part of the JUMP Loop can be removed. Thus, the user can select a new JUMP Loop during each viewing period. In one embodiment, the JUMP Loop sequence can be stored in a volatile memory (e.g., RAM) of the remote controller 106 or the volatile memory of the IRD 102. In yet another embodiment, the JUMP loop sequence can also be stored in the nonvolatile memory, ROM 124 of the remote controller 106 or ROM 37 of the IRD 102.

Figure 2:
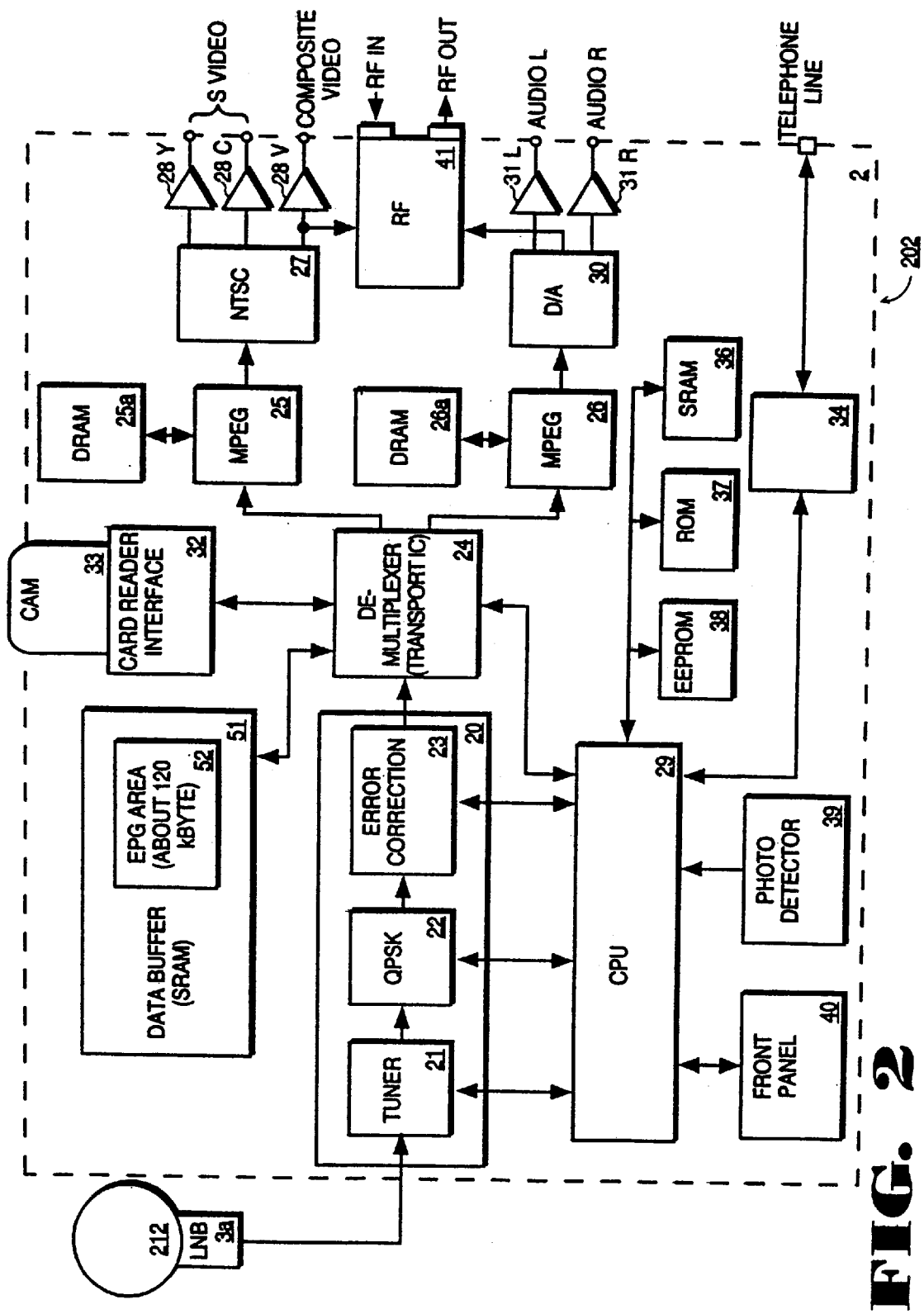
FIG. 2 is a block diagram of an Integrated Receiver Decoder (IRD).

FIG. 2 is a block diagram of the IRD 102. A radio frequency (RF) signal output from the LNB 3a of the antenna 212 is supplied to a tuner 21 of a front end 20. The output from the tuner 21 is supplied to a QPSK demodulation circuit 22 for demodulation. The output from the QPSK demodulation circuit 22 is supplied to an error correcting circuit 23 for error correction. The data is received in encrypted and encoded (i.e., compressed) form.

The transport IC or Demultiplexer 24 receives the data stream, consisting of packets of data, from the error correcting circuit 23 and directs portions of the data stream to the appropriate circuit for processing. The digital data stream sent from a satellite includes headers for classifying the different portions of the data in the digital data stream. The transport IC 24 stores the headers in registers and uses the headers to direct the data. The data stream sent from the satellite, includes video data in the format specified by the Motion Pictures Expert Group standard (MPEG), MPEG audio data and electronic programming guide (EPG) data. Data that is identified by its header to be video data is transferred to MPEG video decoder 25. Data that is identified by its header to be audio data is transferred to MPEG audio decoder 26.

A conditional access module (CAM) 33 includes a CPU, a ROM and a RAM. The conditional access module 33 determines whether the user has the authorization to receive certain data, e.g., audio/video for a pay TV station, using the authorization information stored in its memory. Thus, if the conditional access module 33 determines that the user has authorized access, a key to decrypt the incoming data is provided to the transport IC 24, which decrypts the data using the key provided. In one embodiment, a smart card is utilized. This card is inserted into the card reader interface 32 for interface to the transport IC 24. It will be apparent to one skilled in the art that the conditional access module 33 is not limited to smart cards and may be configured in other kinds of circuitry.

The MPEG video decoder 25 decodes the video signal received from the transport IC 24. DRAM (Dynamic Random Access Memory) 25a, connected to the MPEG video decoder 25, is used for buffering and storage of video data during processing by the MPEG video decoder 25. The decoded digital video signal is supplied, in one embodiment, to an NTSC (National Television System Committee) encoder 27 and converted to a luminance signal (Y) and a chroma signal (C) which are output, respectively, through a buffer amplifier 28Y or 28C, as an S video signal. A composite video signal is also output through a buffer amplifier 28V.

The MPEG audio decoder 26 decodes the digital audio signal. DRAM 26a, connected to the MPEG audio decoder 26, is used for buffering of data and information during processing by the MPEG audio decoder 26. The decoded digital audio signal is converted into an analog audio signal by D/A (Digital-to-Analog) converter 30. The left audio signal is output through buffer amplifier 31L and the right audio signal is output through buffer amplifier 31R.

A RF (Radio Frequency) modulator 41 mixes a composite signal output from the NTSC encoder 27 with an analog audio signal output from the D/A converter 30. The RF modulator 41 converts the mixed signal into an RF signal and outputs the RF signal.

The CPU 29 of IRD 202 is the central control mechanism and executes stored code to perform certain functions of the system. For example, in one embodiment, the CPU 29 receives and processes data to tune to a particular station. In another embodiment, the CPU 29 processes certain data to control the function of the "JUMP" key 108 to allow the user to store a selected number of channels in a JUMP Loop sequence. In addition, the CPU 29 receives and processes the user input, received from the front panel buttons or switches 40 and the photodetector circuit 39 to provide the user functionality and access to the system described herein. In addition, the CPU 29 accesses user settings, user selections of operation keys 130 on remote controller 106, and preferences for processing of information and configuration of the system. In addition, volatile memory, such as RAM (Random Access Memory) and SRAM 36 is preferably used to store information accessed by the CPU 29, including the stations of the JUMP Loop in accordance with the teachings of the present invention. Various user settings can also be stored in the nonvolatile memory, such as EEPROM 38. Moreover, the CPU 29 maintains a list of pointers, stored in SRAM 36, to the channel information and program information stored in the SRAM 36.

The CPU 29 formulates the format and other digital data that form the messages printed on the screen, such as messages generated regarding the addition or removal of stations from the JUMP Loop. Data that is representative of a message, is then forwarded to the transport IC 34, which then forwards the data to the DRAM 25a of the MPEG video decoder 25 for subsequent output to the monitor 100 for display.

Figure 3:
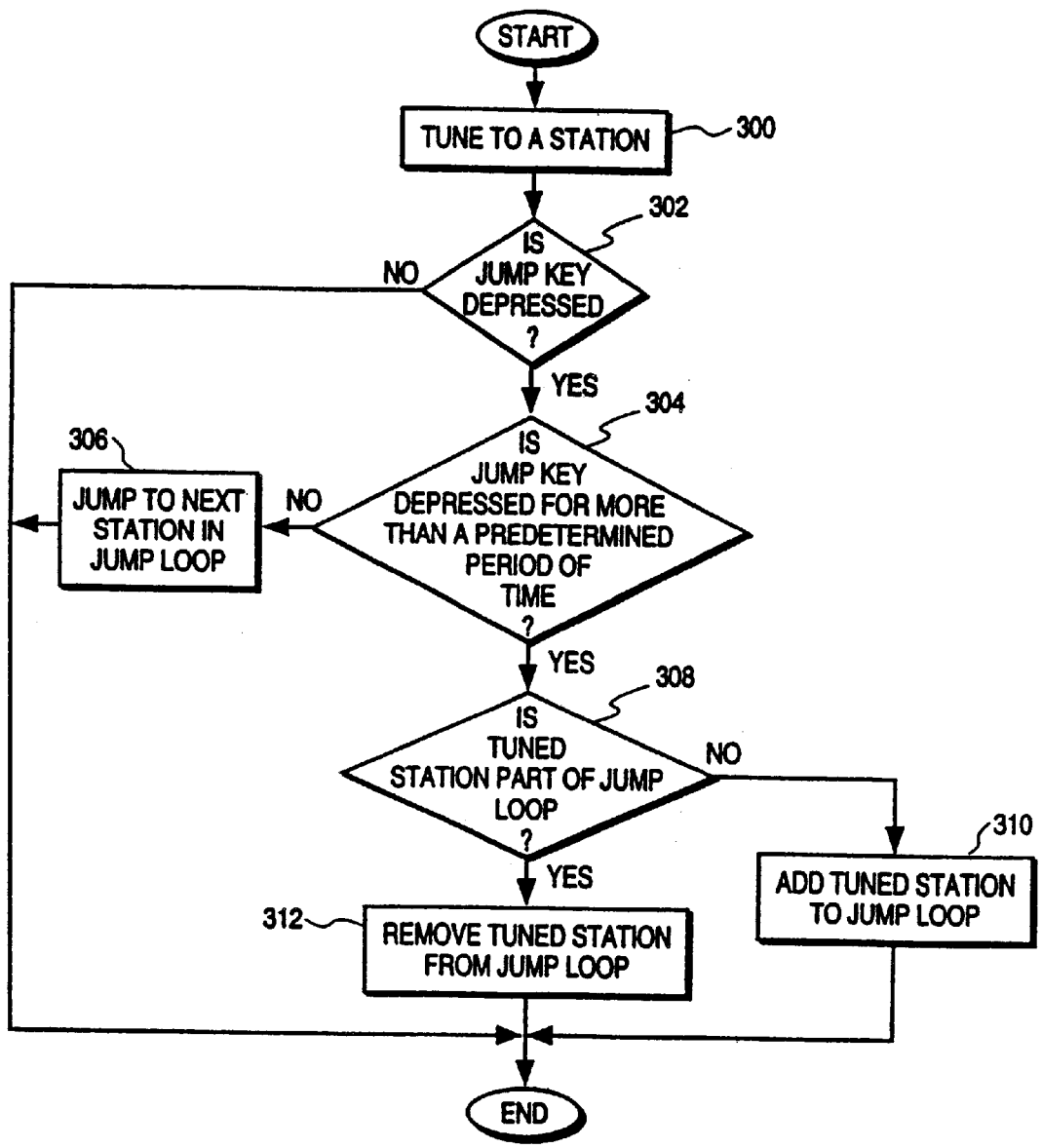
FIG. 3 is a flow chart illustrating the operation of the JUMP Loop of the present invention.

A flow chart of how the Jump Loop Mode of the present invention functions in one embodiment is illustrated in FIG. 3. In step 300, the user will tune to a particular station on a monitor 100 (e.g., a TV set) using remote controller 106. The user may push the numbers "1" and "0" on the key pad of the remote controller 106, which are then transmitted 110 to the IRD 102. The IRD 102 then tunes to station "10" which can be connected using (e.g., an analog cable 204) to monitor 100. It is to be appreciated in another embodiment that the IRD 102 can be an integral part of a monitor 100, such as a TV set.

In the next step 302, it must be determined whether the "JUMP" key 108 is depressed. In other words, has the user pressed or clicked "JUMP" key 108. If the answer is no, the sequence ends at this point, and the system can continue testing to determine whether the "JUMP" key 108 is depressed or perform another function. It should be readily apparent that the test for the depression of the "JUMP" key 108 may be one of many tests performed to determine the keys depressed by the user. Alternately, the tests may be interrupts generated when particular keys are depressed.

If the "JUMP" key 108 is depressed, then in step 304, it must be determined whether the "JUMP" key 108 has been depressed for more then a predetermined period of time. In one embodiment, the predetermined period of time is approximately two seconds.

If the "JUMP" key 108 has not been depressed for more than the predetermined period of time, then in step 306, the DBS system will jump to (i.e., tune to) the next station in the JUMP Loop. Preferably the next station is considered to be the next higher station number found among the JUMP Loop stations. For example, if the JUMP Loop consists of station 100, station 200 and station 300 and the currently tuned station of step 300 is station 250, then in step 306, the next JUMP station is station 300.

If, however, the "JUMP" key 108 is depressed for more than the predetermined period of time, then in step 308, it must be determined whether the currently tuned station is already part of the JUMP Loop. If the answer is no, in step 310, the tuned station is added to the JUMP loop and the sequence ends. In one embodiment, a message appears to the user indicating after step 310 that the tuned station has been assigned to the JUMP Loop. If, on the other hand, the tuned station is already part of the JUMP Loop, then in step 312, the currently tuned station is removed from the JUMP Loop and the sequence ends. In one embodiment, a message appears to the user indicating after step 312 that the currently tuned station is deleted from the JUMP Loop.

Preferably, the number of stations which can be made part of the JUMP Loop is limited. In the present embodiment, the JUMP Loop can consist of up to five stations. If the user attempts to add more than the maximum number of stations, it is preferred that an overwrite function occurs. For example, in one embodiment, if the user sets or stores more than five JUMP stations in a single viewing period, the sixth JUMP station will automatically overwrite the first JUMP station in the loop. This will continue for each additional JUMP station added. For example, if the user then adds a seventh JUMP station, the seventh JUMP station will automatically override the second JUMP station, which is now the "oldest" or first station in the loop. Once a user selects at least two JUMP stations to be included in a complete JUMP Loop, the user needs to merely press the JUMP key or JUMP button repeatedly (e.g., for less than the predetermined period of time) to view the stations in the order that they were set or assigned to the JUMP Loop. Of course, at any time, the user can add or remove JUMP stations simply by holding the JUMP key down for at least the predetermined amount of time.

Figure 4A:
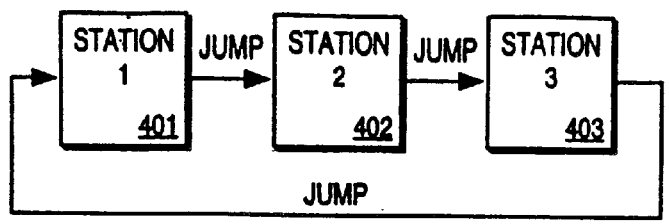
FIG. 4A is a state diagram illustrating one embodiment of the present invention.

FIGS. 4A–4D are state diagrams that illustrate the use of the Jump Loop Mode. FIG. 4A illustrates a complete JUMP Loop sequence that includes three JUMP stations. The stations are illustrated consecutively in the order in which they were set. In other words, station 1 (401) was selected prior to station 2 (402), and station 2 (402) was selected as a JUMP station prior to station 3 (403). As a user consecutively pushes the JUMP key or button 108, the user will be switched between station 1 (401), station 2 (402), station 3 (403) and then back to station 1 (401).

Figure 4B:
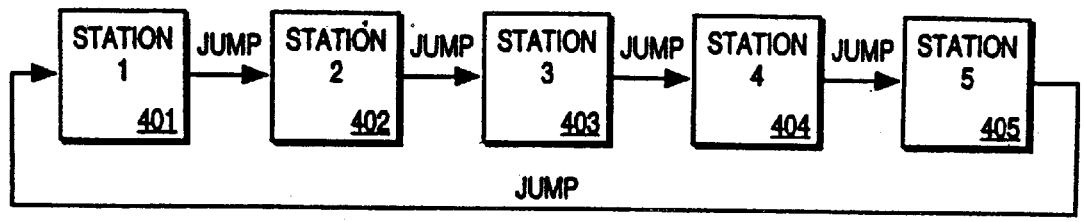
FIG. 4B is a state diagram illustrating a change to the embodiment of FIG. 4A.

FIG. 4B is a state diagram that illustrates that stations 4 (404) and 5 (405) have been added to the JUMP loop sequence of FIG. 4A. In order to add station 4 (404) to the JUMP Loop, the user must first tune to station 4 (404) and then depress or press the JUMP key 108 for a predetermined period of time (e.g., 2 seconds). A similar process is repeated to add station 5 (405) to the JUMP Loop. Therefore, when a user presses the JUMP button 108, the user tunes into station 1 (401), presses or depresses the JUMP key/button 108, and the user tunes into station 2 (402), presses the JUMP key (108) and then tunes into station 3 (403), presses the JUMP key 108 again to tune into station 4 (404) and then presses the JUMP key 108 to tune into station 5 (405) and then upon pressing the JUMP key, the user is tuned again to station 1 (401) at the beginning of the JUMP Loop. The user presses the JUMP key 108 for less than the predetermined period of time to jump between stations in the JUMP Loop.

Figure 4C:
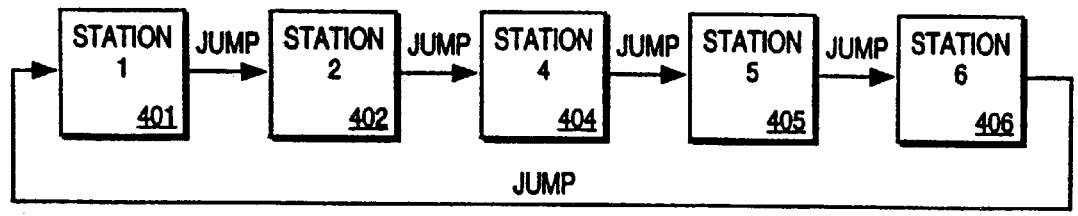
FIG. 4C is a state diagram illustrating a change to the embodiment of FIG. 4B.

FIG. 4C illustrates how the sequence of the JUMP Loop of FIG. 4B changes upon the removal of station 3 (403) and the addition of station 6 (406). The user tunes to station 3 (403) and then depresses the JUMP key 108 for at least the predetermined period of time to remove station 3 (403) from the JUMP Loop. The complete JUMP loop sequence now goes from station 1 (401), to station 2 (402), to station 4 (404), to station 5 (405), to station 6 (406) and then back to station 1 (401) again.

Figure 4D:
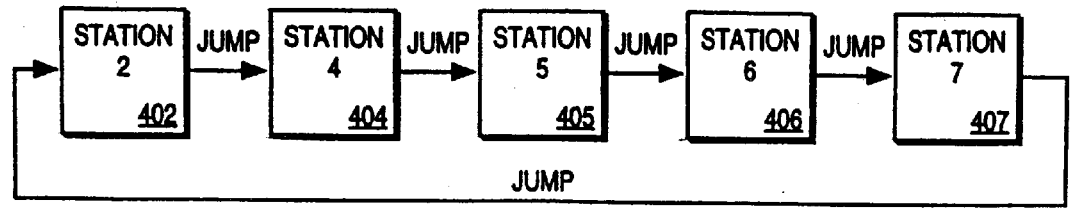
FIG. 4D is a state diagram illustrating a change to the embodiment of FIG. 4C.

FIG. 4D is a continuation of FIG. 4C and illustrates the addition of a sixth station to the JUMP Loop, such as station 7 (407). Because the preferred embodiment allows a maximum of five stations in the JUMP Loop, the addition of a sixth station, such as station 7 (407) causes an overwrite of station 1 (401), which is the first assigned station in the JUMP Loop. As a result, the JUMP Loop sequence now begins with station 2 (402), then proceeds to station 4 (404), to station 5 (405), then to station 6 (406), to station 7 (407) and then finally back to station 2 (402) in a complete JUMP Loop sequence. It is to be appreciated that, if desired, the present invention can be modified to allow a user to add more than five stations to the JUMP Loop.

In the above description, numerous specific details are given to be illustrative and not limiting of the present invention. It will also be apparent to one skilled in the art that the invention may be practiced without these specific details. Moreover, in some instances well-known electrical equipment and circuits have not been set forth in detail in order not to unnecessarily obscure the present invention.

What is claimed is:

1. A system, comprising:
   a tuning device to receive video signals and to tune to a station;
   a remote controller coupled to the tuning device to command the tuning device to tune to a selected station, the remote controller having a "JUMP" key that allows a user to store a plurality of stations as a JUMP Loop in a volatile memory, wherein the user can press the JUMP key for no longer than a first period of time, the first period of time being shorter than a second period of time, to jump between said stations in the JUMP Loop, and wherein the user can press the JUMP key for at least the second period of time to remove a station already in the JUMP loop to which the tuning device is currently tuned from the JUMP loop; and
   a monitor, coupled to the tuning device, to display a tuned station.

2. The system of claim 1, wherein the monitor is a TV set.

3. The system of claim 1, wherein the tuning device is an Integrated Receiver Decoder (IRD).

4. A method of using a JUMP Loop comprising:

tuning a tuner to a station to receive video signals;

determining whether a JUMP key on a remote controller for the tuner is depressed for a period of time longer than a second predetermined period of time, the second predetermined period of time being longer than a first predetermined period of time;

jumping from the station to which the tuner is tuned to the next station in a JUMP Loop if the JUMP key is depressed for at least the first predetermined period of time and less than the second predetermined period of time;

determining whether the station to which the tuner is tuned is part of the JUMP Loop if the JUMP key is depressed for more than the second predetermined period of time;

adding the station to which the tuner is tuned to the JUMP Loop if the JUMP key is depressed for more than the second predetermined period of time and if the station to which the tuner is tuned is not already part of the JUMP Loop; and removing the station to which the tuner is tuned from the JUMP Loop if the JUMP key is depressed for more than the second predetermined period of time and if the station to which the tuner is tuned is already part of the JUMP Loop.

5. The method of claim 4, wherein the second predetermined period of time is about two seconds.

6. A method to toggle among a plurality of stations comprising:

tuning to a first station;

assigning the tuned first station to a JUMP Loop by pressing a JUMP key on a remote controller for at least a second period of time;

tuning to a second station;

assigning the second station to the JUMP Loop by pressing the JUMP key for at least the second period of time;

tuning to a station that is assigned to the JUMP loop;

removing the tuned assigned station from the JUMP Loop by pressing the JUMP key; and toggling among the plurality of stations assigned to the JUMP loop by pressing the JUMP key for at least a first period of time, the first period of time being less than the second period of time, the plurality of stations including at least the first station and the second station.

7. The method of claim 6, wherein the second predetermined period of time is about two seconds.

8. The method of claim 6, further comprising:

tuning to a third station; and assigning the third station to the JUMP Loop by pressing the JUMP key for at least the second period of time wherein the JUMP Loop is stored in memory and the JUMP Loop includes the first station, the second station and the third station.

9. The method of claim 8, wherein the second station follows the first station, the third station follows the second station and the first station follows the third station in the JUMP loop.

10. The method of claim 8, further comprising:

tuning to a fourth station;

assigning the fourth station to the JUMP Loop by pressing the first key for at least a second period of time;

tuning to a fifth station; and assigning the fifth station to the JUMP Loop by pressing the first key for at least a second period of time, wherein the JUMP Loop is stored in volatile memory and the JUMP Loop includes the first station, the second station, the third station, the fourth station and the fifth station.

11. The method of claim 8, further comprising:

tuning to a station that is assigned to the JUMP loop; and removing the tuned assigned station from the JUMP Loop by pressing the JUMP key for at least the second period of time;

tuning to a fourth station; and assigning the tuned station to the JUMP Loop by pressing the JUMP key for at least the second period of time.

12. The method of claim 6, wherein removing comprises pressing the JUMP key for at least the second period of time to remove the tuned station from the JUMP loop.

13. The method of claim 6, further comprising tuning to a station in the JUMP Loop by pressing the key on the remote controller for at least a first predetermined period of time, the first predetermined period of time being shorter than the second predetermined period of time.

14. A remote control device comprising:

a transmitter to transmit signals from the remote control device to a tuner, the tuner to tune to a broadcast station in response to signals transmitted to the tuner by the remote control device; and a plurality of keys accessible by a user on the remote control device, one key of the plurality of keys identified as a JUMP key, wherein if the JUMP key is selected on the remote controller for at least a first period of time and less than a second period of time, the first period of time being less than the second period of time, the tuner tunes to a station that is one of a plurality of stations of a JUMP Loop, and wherein if the JUMP key is selected on the remote controller for at least the second period of time and, if the currently tuned station is one of the plurality of stations of the JUMP Loop, then the currently tuned station is removed from the JUMP loop.

15. The remote control device as set forth in claim 14, wherein the JUMP loop is stored in memory on the remote control device.

16. The remote control device as set forth in claim 14, wherein the selection of the JUMP key causes the transmitter to transmit a JUMP signal to the tuner.

17. A system comprising a tuning device to receive signals from a remote controller, the tuning device further to tune to a any one of a plurality of stations in response to the received signals, at least a portion of the plurality of stations being in a JUMP Loop, wherein a user can press a JUMP key of the remote controller for at least a first period of time that is less than a second period of time to cause the tuning device to jump between the stations in the JUMP Loop and can press the JUMP key for at least the second period of time while the tuning device is tuned to a station to remove the station to which the tuning device is tuned from the JUMP Loop.

18. The system as set forth in claim 17, wherein the tuning device is further configured to store a plurality of stations as the JUMP Loop in a volatile memory.

* * * * *